United States Patent
Kim et al.

(10) Patent No.: US 12,330,408 B2
(45) Date of Patent: Jun. 17, 2025

(54) METHOD FOR PRODUCING SUBSTRATE FOR MILLIMETER WAVE

(71) Applicant: SENSORVIEW CO., LTD., Seongnam-si (KR)

(72) Inventors: Byoung Nam Kim, Suwon-si (KR); Hong Il Yoo, Gwangmyeong-si (KR); Jong Yup Lee, Incheon (KR); Chul-Keun Park, Seongnam-si (KR)

(73) Assignee: SENSORVIEW CO., LTD., Seongnam-si (KR)

( * ) Notice: Subject to any disclaimer, the term of this patent is extended or adjusted under 35 U.S.C. 154(b) by 132 days.

(21) Appl. No.: 18/184,831

(22) Filed: Mar. 16, 2023

(65) Prior Publication Data

US 2023/0294389 A1    Sep. 21, 2023

(30) Foreign Application Priority Data

Mar. 17, 2022  (KR) .......................... 10-2022-0033202

(51) Int. Cl.
  *B32B 37/24* (2006.01)
  *B32B 7/12* (2006.01)
  *B32B 15/04* (2006.01)
  *H01Q 1/38* (2006.01)

(52) U.S. Cl.
  CPC .............. *B32B 37/24* (2013.01); *B32B 7/12* (2013.01); *B32B 15/043* (2013.01); *B32B 2037/243* (2013.01); *B32B 2250/02* (2013.01); *B32B 2255/06* (2013.01); *B32B 2255/20* (2013.01); *B32B 2255/26* (2013.01); *B32B 2309/02* (2013.01); *B32B 2311/00* (2013.01); *B32B 2457/00* (2013.01); *H01Q 1/38* (2013.01)

(58) Field of Classification Search
CPC ... H01Q 1/38; B32B 2457/00; B32B 2311/00; B32B 2309/02; B32B 2255/26; B32B 2255/20; B32B 2255/06; B32B 2250/02; B32B 2037/243; B32B 15/043; B32B 7/12; B32B 37/24
See application file for complete search history.

(56) References Cited

U.S. PATENT DOCUMENTS

2007/0178300 A1*  8/2007  Amla ...................... B32B 15/08
                                                                428/141
2020/0032026 A1*  1/2020  Nakamura ............. B32B 15/20

FOREIGN PATENT DOCUMENTS

| CN | 100380812 A | 4/2008 |
| JP | 2014-139012 A | 7/2014 |
| KR | 10-2017-0134610 A | 12/2017 |

* cited by examiner

Primary Examiner — Vishal I Patel

(57) ABSTRACT

A method for producing a substrate for millimeter wave comprises the steps of: (a) mixing ceramic powder and Teflon powder; (b) dispersing the mixed ceramic powder and Teflon powder in a dispersion equipment; (c) after the step of (b) dispersing is completed, outputting a paste of a mixture of the ceramic powder and the Teflon powder by additionally adding a solution and a binder to the dispersion equipment and then dispersing the mixture; (d) applying the paste to a first metal thin film; (e) drying the first metal thin film to which the paste is applied; and (f) laminating a second metal thin film on the opposite side of the paste bonded to the dried first metal thin film and then thermally bonding it.

8 Claims, 7 Drawing Sheets

Heat Bonding

METHOD FOR PRODUCING SUBSTRATE FOR MILLIMETER WAVE

CROSS-REFERENCE TO RELATED APPLICATIONS

This application claims priority under 35 U.S.C. § 119(a) to Korean Patent Application No. 10-2022-0033202, filed on Mar. 17, 2022, in the Korean Intellectual Property Office, the disclosure of which is incorporated herein in its entirety by reference.

BACKGROUND

1. Technical Field

The present disclosure relates to a method for producing a substrate, and more particularly to a method for producing a substrate for millimeter wave.

2. Description of the Related Art

In recent years, 5G communication has been started, in which 5G performs communication using a millimeter wave band of 20 GHz or more compared to the existing 4G communication. The millimeter wave band shows a very large attenuation characteristic compared to the low frequency band, and has a characteristic that signal loss due to obstacles is very large.

In the 5G band, very large-capacity IoT data, 360-degree video data, VR data, and various types of big data are supported through mobile communication networks, and for this reason, communication using the millimeter wave band is essential.

Due to the large attenuation characteristics of the millimeter wave band, improved low-loss characteristics are also required for a substrate serving as a transmission line for transmitting signals in the millimeter wave band.

It is known that a dielectric made of Teflon is suitable as a suitable dielectric having a low dissipation factor (Df). However, dielectrics made of Teflon have problems in that it is not easy to bond with the metal thin film constituting the substrate and it is difficult to maintain flatness due to a high coefficient of thermal expansion.

SUMMARY OF THE INVENTION

An object of the present disclosure is to propose a method for producing a substrate for millimeter wave having low loss characteristics.

Another object of the present disclosure is to propose a method for producing a substrate having high bonding force with a metal thin film and having a low coefficient of thermal expansion while using a dielectric made of Teflon.

According to one aspect of the present disclosure, conceived to achieve the objectives above, a method for producing a substrate for millimeter wave is provided, the method comprising the steps of: (a) mixing ceramic powder and Teflon powder; (b) dispersing the mixed ceramic powder and Teflon powder in a dispersion equipment; (c) after the step of (b) dispersing is completed, outputting a paste of a mixture of the ceramic powder and the Teflon powder by additionally adding a solution and a binder to the dispersion equipment and then dispersing the mixture; (d) applying the paste to a first metal thin film; (e) drying the first metal thin film to which the paste is applied; and (f) laminating a second metal thin film on the opposite side of the paste bonded to the dried first metal thin film and then thermally bonding it.

The step (a) includes putting the Teflon powder and the ceramic powder into a pulverizer and pulverizing the Teflon powder through the pulverizer.

The dispersion equipment includes a container and a rotating body coupled to the container, and the rotating body is rotated clockwise and the container is rotated counter-clockwise to disperse.

The solution uses distilled water, alcohol, or any one of organic solvents or a mixture thereof as a solvent.

The solution uses a Teflon dispersion material as a solute.

The binder includes any one of epoxy, acrylic, urethane, and silicone, or a mixture thereof.

In the step (e), it is dried at a temperature of about 100 to 270 degrees to evaporate the solvent.

The step (f) is performed at a temperature equal to or higher than the melting temperature of Teflon.

According to another aspect of the present disclosure, a substrate for millimeter wave produced by the above-described method is provided.

The substrate produced by the method for producing a substrate for millimeter wave of the present disclosure has the advantage of having low loss characteristics, and having a high bonding force with a metal thin film and a low coefficient of thermal expansion while using a dielectric made of Teflon.

DETAILED DESCRIPTION OF THE INVENTION

Figure 1:
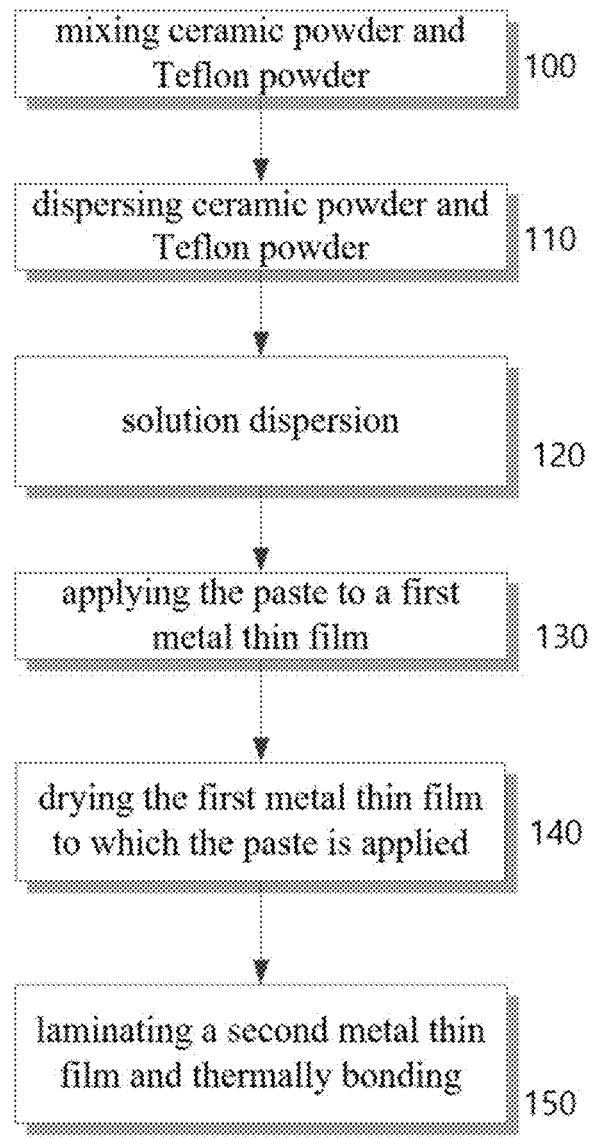
FIG. 1 is a flow chart showing the overall flow of a method for producing a substrate for millimeter wave according to an embodiment of the present disclosure.

In order to fully understand the present disclosure, operational advantages of the present disclosure, and objects achieved by implementing the present disclosure, reference should be made to the accompanying drawings illustrating preferred embodiments of the present disclosure and to the contents described in the accompanying drawings.

Hereinafter, the present disclosure will be described in detail by describing preferred embodiments of the present disclosure with reference to accompanying drawings. However, the present disclosure can be implemented in various different forms and is not limited to the embodiments described herein. For a clearer understanding of the present disclosure, parts that are not of great relevance to the present disclosure have been omitted from the drawings, and like reference numerals in the drawings are used to represent like elements throughout the specification.

Throughout the specification, reference to a part "including" or "comprising" an element does not preclude the existence of one or more other elements and can mean other elements are further included, unless there is specific mention to the contrary. Also, terms such as "unit", "device", "module", "block", and the like described in the specification refer to units for processing at least one function or operation, which may be implemented by hardware, software, or a combination of hardware and software.

FIG. 1 is a flow chart showing the overall flow of a method for producing a substrate for millimeter wave according to an embodiment of the present disclosure.

Referring to FIG. 1, first, Teflon powder and ceramic powder are mixed with each other (step 100).

Teflon powders and ceramic powders are commercially available. Commercially available Teflon powder is often agglomerated rather than in particle units, and an operation of pulverizing such Teflon powder into particles may be performed. For example, pulverization may be performed using a pulverizer, and pulverization may be performed by inserting Teflon powder and ceramic powder together into the pulverizer. The pulverization of the Teflon powder may be achieved while the teflon powder hits the ceramic powder in the pulverizer.

According to an embodiment of the present disclosure, as the Teflon powder, one of PTFE, PFA, ETFE, PCTFE and FEP, or a mixture of two or more thereof may be used. In addition, as the ceramic powder, one of $SiO_2$, $Al_2O_3$ and $TiO_2$, or a mixture of two or more thereof may be used.

Considering the required dielectric constant and manufacturing cost, it is preferable to use PTFE powder as the Teflon powder, but it will be apparent to those skilled in the art that other types of Teflon powder may be used. In addition, as the ceramic powder, $SiO_2$ material may be mainly used, and $Al_2O_3$ or $TiO_2$ may be added in small amounts.

Figure 2:
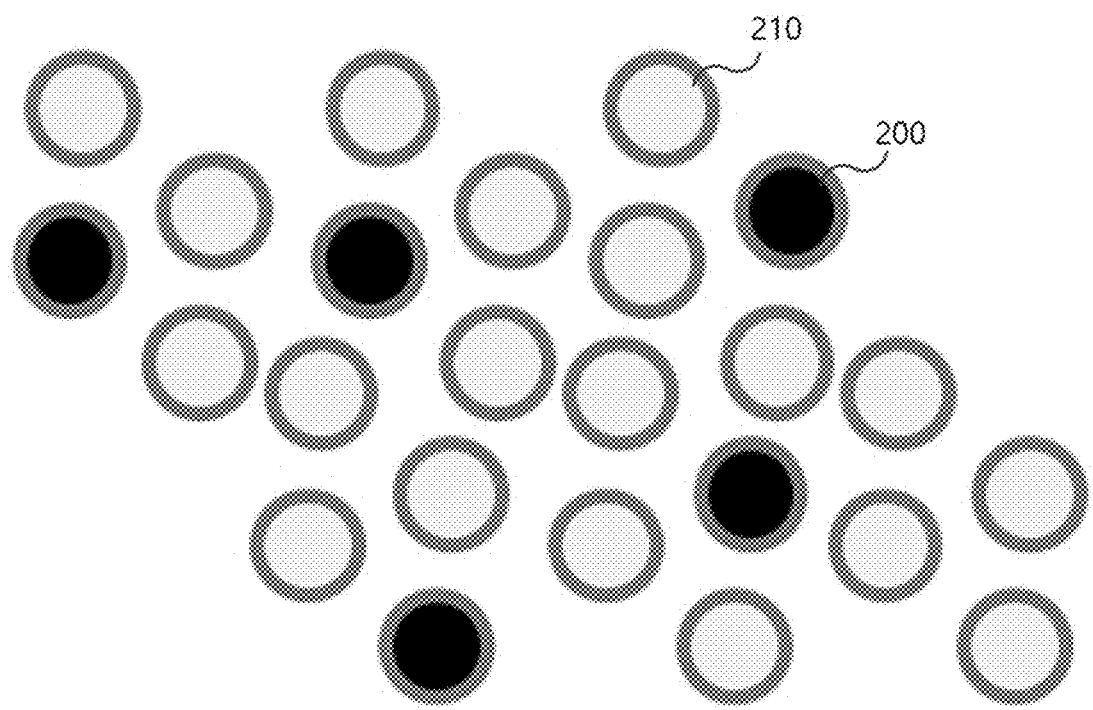
FIG. 2 shows a state in which ceramic powder and Teflon powder are mixed according to an embodiment of the present disclosure.

FIG. 2 shows a state in which ceramic powder and Teflon powder are mixed according to an embodiment of the present disclosure.

Referring to FIG. 2, since the Teflon powder 200 and the ceramic powder 210 are mixed in a powder state, there is no binding force between the powders in step 100.

According to a preferred embodiment of the present disclosure, the Teflon powder is preferably a Teflon powder that has not undergone an electron beam process. The Teflon powder that has undergone the electron beam process is called virgin plastic, and if this virgin plastic powder is used, it will not have good bonding strength in the later curing process. As such, powders that have not been subjected to the electron beam process are aggregated together, and for this reason, the above-described pulverization operation is separately required.

According to a preferred embodiment of the present disclosure, it is preferable to set the proportion of Teflon powder higher than that of ceramic powder and mix them.

Referring back to FIG. 1, after the ceramic powder and the Teflon powder are mixed, the Teflon powder and the ceramic powder are dispersed (step 110). Here, the dispersion is a process that allows the mixed Teflon powder and ceramic powder to be mixed in a uniform distribution.

Figure 3:
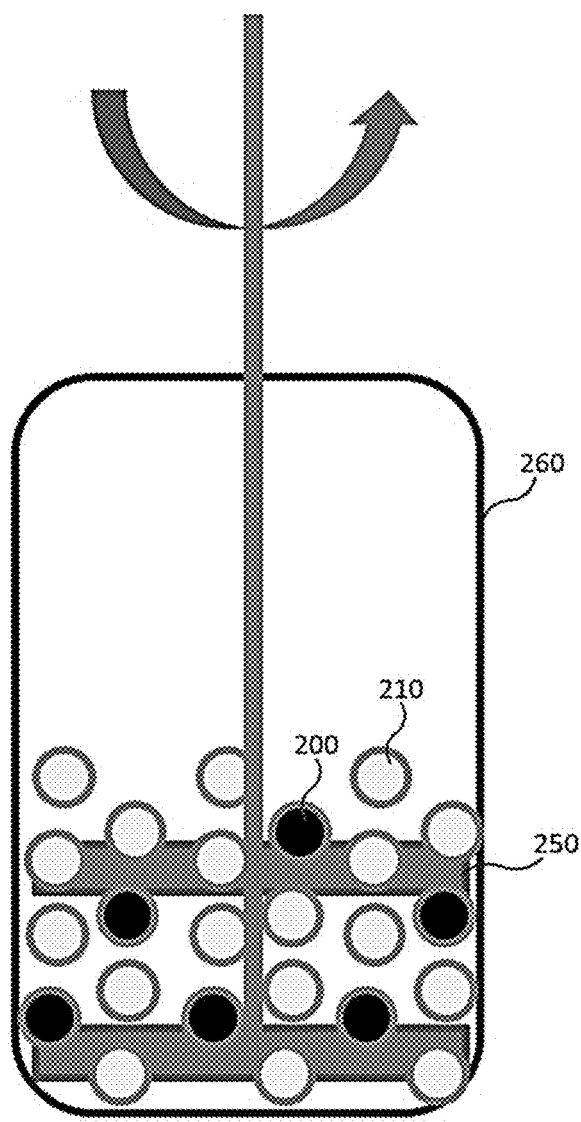
FIG. 3 conceptually shows a dispersion process according to an embodiment of the present disclosure.

FIG. 3 conceptually shows a dispersion process according to an embodiment of the present disclosure.

According to an embodiment of the present disclosure, the dispersion of the Teflon powder and the ceramic powder may be performed by a method of rotating the Teflon powder and the ceramic powder in the container 260 equipped with a propeller 250.

As the dispersion equipment, ultrasonic dispersion equipment, 3 roll mil, basket mill, homo mixer equipment, propeller stirring equipment, vibration equipment, etc. may be used, and preferably propeller stirring equipment may be used.

According to a preferred embodiment of the present disclosure, the dispersion time may be set between 1 minute and 60 minutes. While continuously checking the degree of dispersion by using mapping analysis equipment, the dispersion work may be continued until the required degree of dispersion is reached.

According to an embodiment of the present disclosure, the rotating body (for example, the propeller 250) included in the dispersion equipment may be rotated clockwise, and the container 260 of the dispersion equipment may be rotated counterclockwise, so that the Teflon powder and the ceramic powder can be evenly dispersed.

Referring to FIG. 1, solution dispersion is performed after the Teflon powder and the ceramic powder are dispersed (step 120).

A solution and a binder are dispersed together with the Teflon powder and the ceramic powder to convert the Teflon powder and the ceramic powder into a paste form.

Figure 4:
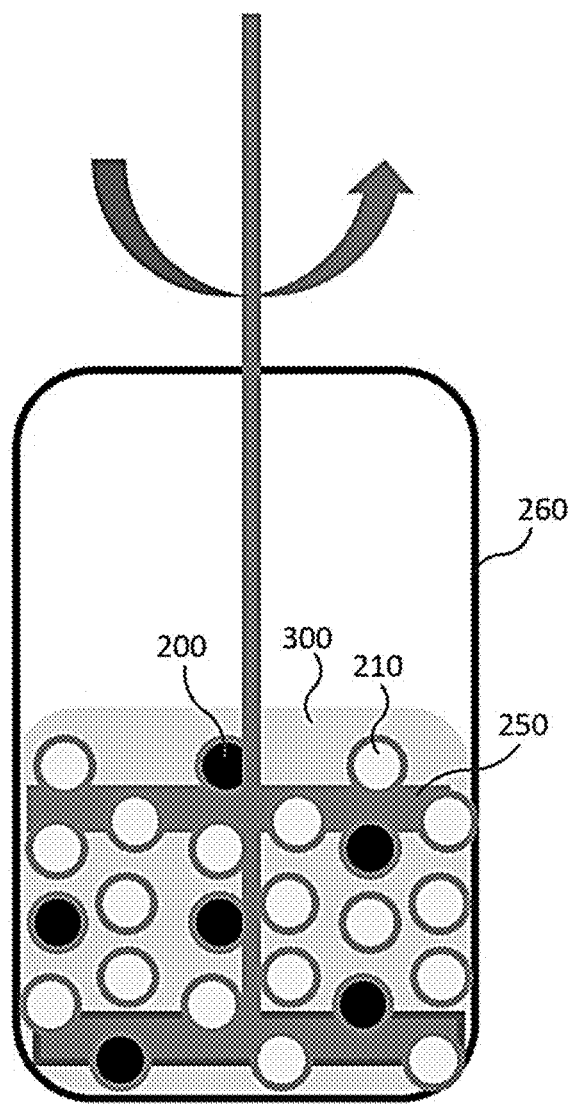
FIG. 4 conceptually shows a process of solution dispersion according to an embodiment of the present disclosure.

FIG. 4 conceptually shows a process of solution dispersion according to an embodiment of the present disclosure.

Referring to FIG. 4, solution dispersion is performed by putting the Teflon powder 200, the ceramic powder 210 and the solution 300 into a dispersion container. As described above, a binder (not shown) may additionally be put into the container.

According to an embodiment of the present disclosure, a Teflon dispersion material may be used as a solute of the solution. In addition, as a solvent, any one of distilled water, alcohol, and an organic solvent, or a mixture thereof may be used.

According to an embodiment of the present disclosure, as the binder, any one of epoxy, acrylic, urethane, and silicone, or a mixture thereof may be used.

When the ceramic powder, Teflon powder, solution and binder are rotated in a dispersion container, the mixture in the container is converted into a paste form. Dispersion in the dispersion container continues until conversion of the mixtures into a paste is complete.

Through the solution dispersion, the Teflon powder and the ceramic powder become a paste state, so that they become a state that can be applied to metal.

Referring to FIG. 1, after the solution dispersion is completed, a mixture of ceramic powder and Teflon powder in a paste state is applied on a first metal thin film to a predetermined thickness (step 130).

Figure 5:
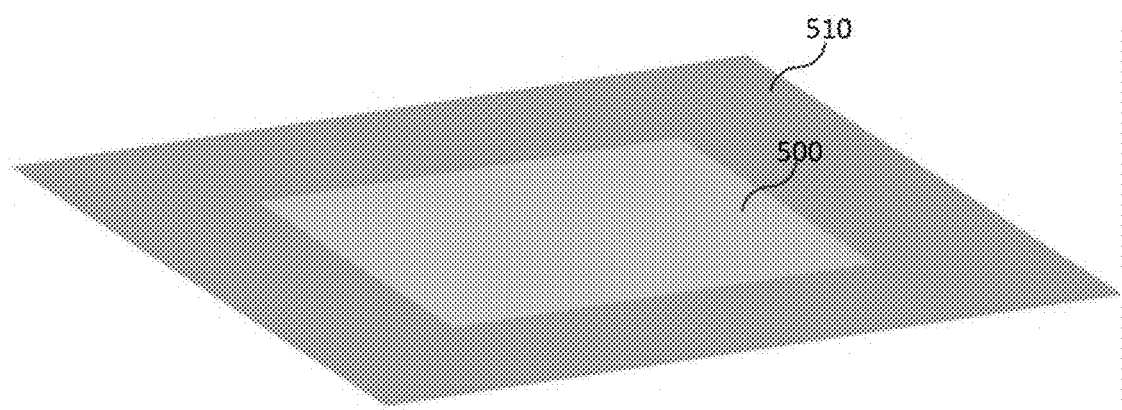
FIG. 5 shows a state in which a paste is applied to a metal thin film according to an embodiment of the present disclosure.

FIG. 5 shows a state in which a paste is applied to a metal thin film according to an embodiment of the present disclosure.

Referring to FIG. 5, the paste 500 is applied to the first metal thin film 510.

According to a preferred embodiment of the present disclosure, the mixture in a paste state is applied in a desired shape using a metal mask. According to an embodiment of the present disclosure, it may be applied in a desired shape through a metal mask in a silk printing method.

Referring to FIG. 1, after a mixture of Teflon powder and ceramic powder in a paste state is applied to the surface of the metal thin film, the applied first metal thin film is dried (step 140). According to an embodiment of the present disclosure, drying may be performed at a temperature of about 100° C. to 270° C.

According to an embodiment of the present disclosure, drying may be performed in a chamber or may be performed using a reflow equipment.

Figure 6:
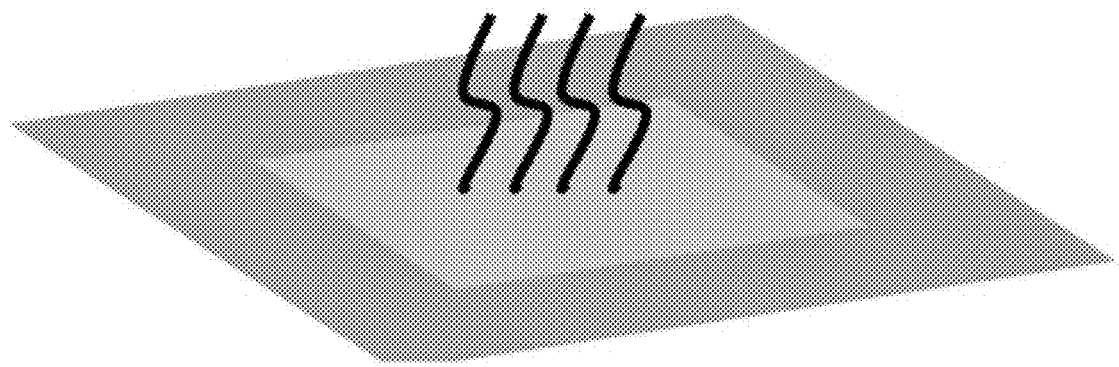
FIG. 6 shows a process of drying a first metal thin film to which a paste is applied according to an embodiment of the present disclosure.

FIG. 6 shows a process of drying a first metal thin film to which a paste is applied according to an embodiment of the present disclosure.

The paste made through solution dispersion contains solvents such as distilled water and alcohol, and drying is performed to remove these solvents. When dried at a temperature of 100° C. to 270° C., the solvents are evaporated, leaving only ceramic and Teflon materials. If the solvent remains in the paste, it acts as a major factor in reducing the dissipation factor (Df), so it is essential to evaporate all the solvents through drying. Drying temperature may be determined based on the type of solvent used.

In addition, the ceramic material and the Teflon material in a paste state are hardened through the drying operation, but do not have a strong bonding force with the first metal thin film.

Referring to FIG. 1, a second metal thin film is laminated on the opposite side (opposite side of the side on which the first metal thin film is applied) of the hardened dielectric (ceramic material+Teflon material), and thermal bonding is performed on the first metal thin film, the dielectric, and the second metal thin film (step 150).

Figure 7:
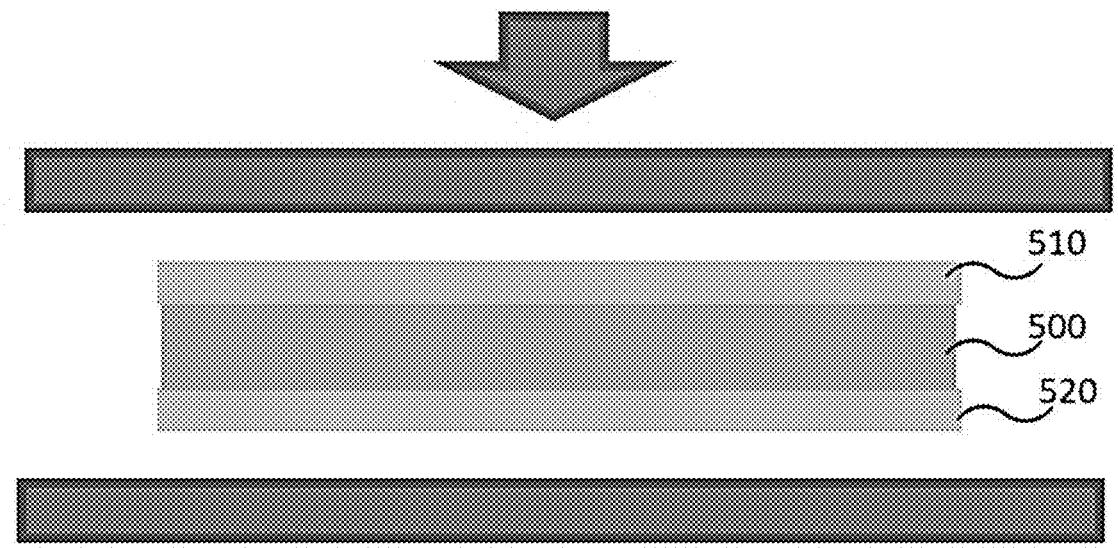
FIG. 7 shows a process of performing thermal bonding on a first metal thin film, a dielectric and a second metal thin film according to an embodiment of the present disclosure.

FIG. 7 shows a process of performing thermal bonding on a first metal thin film, a dielectric and a second metal thin film according to an embodiment of the present disclosure.

According to a preferred embodiment of the present disclosure, vacuum thermal bonding is performed, and melting and planarization of the dielectric is achieved by the thermal bonding. Since the melting temperature of the Teflon material is 340° C. or higher, thermal bonding may be performed at a temperature of about 380° C. for about an hour.

Through the thermal bonding, the first metal thin film 510 and the second metal thin film 520 are in close contact with the dielectric 500 made of Teflon, and planarization is performed on the dielectric made of Teflon.

Figure 8:
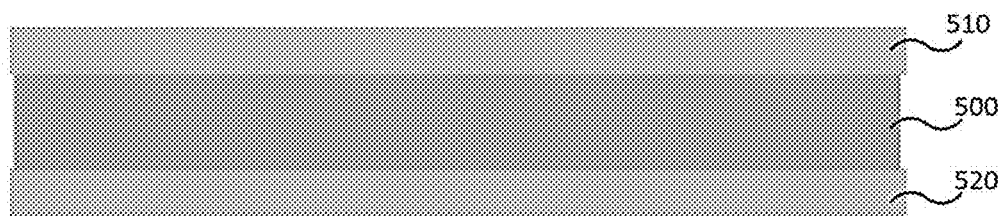
FIG. 8 shows a substrate produced according to an embodiment of the present disclosure.

FIG. 8 shows a substrate produced according to an embodiment of the present disclosure.

Referring to FIG. 8, the first metal thin film 510 may function as a signal line through which RF signals are transmitted or a radiator of an antenna on the substrate, and the second metal thin film 520 may function as a ground on the substrate.

When Teflon powder and ceramic powder are formed into a paste and bonded to a metal thin film as in the present disclosure, it can have a low dissipation factor of 0.001 or less while having good bonding strength by thermal bonding.

In addition, since a substrate is produced by making a paste of a mixture of ceramic powder and Teflon powder, it is possible to have a low coefficient of thermal expansion, and through this, it is possible that the dielectric is not deformed in the process of thermal bonding and have good flatness. Furthermore, since the substrate produced by the method of the present disclosure is used in the millimeter wave band, considerable heat is generated during signal transmission, and the shape of the dielectric can be prevented from being distorted even by the heat generated during use.

While the present disclosure is described with reference to embodiments illustrated in the drawings, these are provided as examples only, and the person having ordinary skill in the art would understand that many variations and other equivalent embodiments can be derived from the embodiments described herein.

Therefore, the true technical scope of the present disclosure is to be defined by the technical spirit set forth in the appended scope of claims.

What is claimed is:

1. A method for producing a substrate for millimeter wave, the method comprising the steps of:
    (a) mixing ceramic powder and polytetrafluoroethylene (PTFE) powder;
    (b) dispersing the mixed ceramic powder and PTFE powder in a dispersion equipment;
    (c) after the step of (b) dispersing is completed, outputting a paste of a mixture of the ceramic powder and the PTFE powder by additionally adding a solution and a binder to the dispersion equipment and then dispersing the mixture;
    (d) applying the paste to a first metal thin film;
    (e) drying the first metal thin film to which the paste is applied; and
    (f) laminating a second metal thin film on the opposite side of the paste bonded to the dried first metal thin film and then thermally bonding it.

2. The method according to claim 1, wherein the step (a) includes putting the PTFE powder and the ceramic powder into a pulverizer and pulverizing the PTFE powder through the pulverizer.

3. The method according to claim 1, wherein the dispersion equipment includes a container and a rotating body coupled to the container, and the rotating body is rotated clockwise and the container is rotated counterclockwise to disperse.

4. The method according to claim 1, wherein the solution uses any one of distilled water, alcohol, or organic solvent or a mixture thereof as a solvent.

5. The method according to claim 1, wherein the solution uses a polytetrafluoroethylene (PTFE) dispersion material as a solute.

6. The method according to claim 1, wherein the binder includes any one of epoxy, acrylic, urethane, and silicone, or a mixture thereof.

7. The method according to claim 4, wherein the step (e) includes drying at a temperature of about 100° C. to 270° C. to evaporate the solvent.

8. The method according to claim 1, wherein the step (f) is performed at a temperature equal to or higher than the melting temperature of the PTFE powder.

* * * * *